(12) United States Patent
Fukasawa et al.

(10) Patent No.: US 9,266,186 B2
(45) Date of Patent: Feb. 23, 2016

(54) APPARATUS AND METHOD OF TREATING SUBSTRATE

(71) Applicant: SAMSUNG DISPLAY CO., LTD., Yongin, Gyeonggi-Do (KR)

(72) Inventors: Takayuki Fukasawa, Seoul (KR); Klhyuk Kim, Seoul (KR); Ji Hun Kim, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 484 days.

(21) Appl. No.: 13/714,738

(22) Filed: Dec. 14, 2012

(65) Prior Publication Data

US 2013/0248498 A1   Sep. 26, 2013

(30) Foreign Application Priority Data

Mar. 23, 2012   (KR) ......................... 10-2012-0030134

(51) Int. Cl.
*B23K 10/00* (2006.01)
*H01J 37/32* (2006.01)

(52) U.S. Cl.
CPC .......... *B23K 10/00* (2013.01); *H01J 37/32091* (2013.01); *H01J 37/32137* (2013.01); *H01J 37/32532* (2013.01)

(58) Field of Classification Search
CPC .............. B23K 10/00; H01J 37/32091; H01J 37/32137; H01J 37/32532; H05H 1/36; H05H 1/34

USPC ............... 219/121.4, 121.42, 121.52, 121.59; 118/723 E, 723 I, 723 R; 156/345.47, 156/345.48

See application file for complete search history.

(56) References Cited

U.S. PATENT DOCUMENTS

| | | | |
|---|---|---|---|
| 8,898,889 B2* | 12/2014 | Nam et al. .................. | 29/740 |
| 8,968,513 B2* | 3/2015 | Hayashi ................. | 156/345.44 |
| 2002/0170676 A1* | 11/2002 | Mitrovic et al. ......... | 156/345.47 |
| 2004/0050495 A1 | 3/2004 | Sumiya et al. | |
| 2005/0061445 A1* | 3/2005 | Koshiishi et al. ........ | 156/345.47 |
| 2009/0242135 A1* | 10/2009 | Koshimizu et al. ...... | 156/345.48 |
| 2011/0056435 A1* | 3/2011 | Yamazaki ................ | 118/723 R |
| 2011/0068085 A1 | 3/2011 | Brillhart et al. | |

FOREIGN PATENT DOCUMENTS

| | | | |
|---|---|---|---|
| JP | 2002-110649 | A | 4/2002 |
| JP | 2003059841 | A | 2/2003 |
| JP | 4220316 | B2 | 2/2009 |
| JP | 4547711 | B2 | 9/2010 |
| JP | 2011161940 | A | 8/2011 |
| JP | 2012-174682 | A | 9/2012 |
| KR | 100442310 | B1 | 7/2004 |
| KR | 101091555 | B1 | 12/2011 |
| KR | 1020120094980 | A | 8/2012 |

* cited by examiner

*Primary Examiner* — Mark Paschall
(74) *Attorney, Agent, or Firm* — Cantor Colburn LLP

(57) ABSTRACT

A substrate-treating apparatus includes a process chamber including a space therein, a lower electrode which is in the space of the process chamber and supports the substrate, an upper electrode which faces the lower electrode in the process chamber, a high frequency supply line which includes a feed point which applies a high frequency power to the lower electrode, and a modulator which asymmetrically supplies a dielectric substance to a lower portion of the lower electrode with reference to a center portion of the lower electrode.

14 Claims, 19 Drawing Sheets

APPARATUS AND METHOD OF TREATING SUBSTRATE

This application claims priority to Korean Patent Application No. 10-2012-0030134, filed on Mar. 23, 2012, and all the benefits accruing therefrom under 35 U.S.C. §119, the contents of which are hereby incorporated by reference.

BACKGROUND

1. Field

The disclosure relates to a substrate-treating apparatus and a method of treating the substrate. More particularly, the disclosure relates to a substrate-treating apparatus for treating a substrate using plasma and a method of treating the substrate using the plasma.

2. Description of the Related Art

In general, a liquid crystal display, an organic light emitting diode, a solar cell and a semiconductor device are manufactured by various processes using plasma, such as a plasma etching process, a plasma chemical vapor deposition process, a sputtering process, etc. Display devices or methods of displaying an image may employ, for example, the liquid crystal display, the organic light emitting diode, the solar cell and/or the semiconductor device, which include a substrate.

A plasma treating apparatus includes an upper electrode installed inside a chamber and a lower electrode installed to face the upper electrode. When a high frequency electric power is applied to the lower electrode, the plasma is formed between the upper electrode and the lower electrode to treat a substrate loaded in the chamber.

However, an intensity of an electric field formed in the lower electrode is not uniform as the size of the substrate becomes large with increasing display device sizes. As a result, it is difficult to attain a high etching rate in an etching process, and a high uniformity of layers in deposition and sputtering processes.

SUMMARY

The disclosure provides an apparatus for uniformly treating a substrate.

The disclosure provides a method of uniformly treating a substrate.

One or more embodiments provide an apparatus for treating a substrate, the apparatus including a process chamber including a space therein, a lower electrode disposed in the space of the process chamber and supporting the substrate, an upper electrode which faces the lower electrode in the space of the process chamber, a high frequency supply line including a feed point which applies a high frequency power to the lower electrode, and a modulator which asymmetrically supplies a dielectric substance to a lower portion of the lower electrode with reference to a center portion of the lower electrode.

The feed point may include a center feed point which applies the high frequency power to the center portion of the lower electrode and a peripheral feed point which applies the high frequency power to a peripheral area of the lower electrode, spaced apart from the center portion of the lower electrode. The modulator is proximate to the peripheral feed point.

The lower electrode may include a trench in a lower surface thereof, the trench between the center feed point and the peripheral feed point. The modulator includes a dielectric substance supply unit which supplies the dielectric substance in a fluid state into the trench and withdraws the dielectric substance from the trench.

The modulator may include a block at the lower portion of the lower electrode and including a storage space therein, and a dielectric substance supply unit which supplies the dielectric substance in a fluid state into the storage space of the block and withdraws the dielectric substance from the storage space of the block.

The block may have a ring shape which surrounds the peripheral feed point.

The modulator may include a dielectric substance block at the lower portion of the lower electrode between the center feed point and the peripheral feed point, and a dielectric substance block moving unit which moves the dielectric substance block and changes a distance between the lower electrode and the dielectric substance block.

The modulator may include a first block disposed between the center feed point and the peripheral feed point and including a first storage space therein, a second block disposed between the peripheral feed point and an outer edge of the lower electrode and including a second storage space therein, a connection line which connects the first storage space and the second storage space to each other, and a fluid transfer unit which moves the dielectric substance in a fluid state through the connection line and selectively in and out of the first storage space and the second storage space.

Each of the first block and the second block may have a trapezoid shape, and two sides of the trapezoid shape are collinear with diagonal lines crossing each other at the center portion of the lower electrode.

The first block and the second block may be arranged in parallel with each other and each of the first block and the second block may have a rectangular shape.

The apparatus may include two peripheral feed points which are arranged along a circumference of the center feed point, and respective lines between the peripheral feed points and the center feed point form a right angle at the center feed point.

The feed point may include a center feed point and a peripheral feed point. The high frequency supply line may include a first supply line including the center feed point which applies the high frequency power to the center portion of the lower electrode and a second supply line connected to the first supply line, where the second supply line applies the high frequency power to a peripheral area of the lower electrode, spaced apart from the center portion of the lower electrode. The modulator is provided on the second supply line.

The modulator may include a dielectric substance block which surrounds the second supply line, and a dielectric substance block moving unit which repeatedly moves the dielectric substance block along the second supply line.

The second supply line may have a taper area having a cross-sectional width that gradually decreases in a direction toward the peripheral feed point, and the dielectric substance block is repeatedly moved in the taper area.

The modulator may include a block surrounding the second supply line and including a storage space therein, and a dielectric substance supply unit which supplies the dielectric substance in a fluid state into the storage space of the block and withdraws the dielectric substance from the storage space of the block.

One or more embodiments provide a method of treating a substrate, the method provided as follows. A high frequency power is applied to a lower electrode which faces an upper electrode, to generate an electric field between the upper electrode and the lower electrode. A process gas excited to a plasma state by the electric field is supplied to the substrate which is supported by the lower electrode. A dielectric substance is asymmetrically disposed at a lower portion of the lower electrode with reference to a center portion of the lower electrode, while the high frequency power is applied to the lower electrode.

The lower electrode may include a storage space in the lower portion thereof, into which the dielectric substance in a fluid state is supplied. A first process in which the dielectric substance is in the storage space and a second process in which the dielectric substance is not in the storage space, are alternately repeatedly performed while the high frequency power is applied.

A block, which includes a same material as the dielectric substance, is placed at the lower portion of the lower electrode, and a first process in which the block contacts the lower electrode and a second process in which the block is spaced apart from the lower electrode, are alternately repeatedly performed while the high frequency power is applied.

The high frequency power may be applied to the lower electrode through a first supply line which includes a center feed point at the center portion of the lower electrode and through a second supply line which includes a peripheral feed point at a peripheral area of the lower electrode, spaced apart from the center portion of the lower electrode. The block including the same material as the dielectric substance surrounds the second supply line and moves along the second supply line.

The dielectric substance in a fluid state is alternately repeatedly supplied into a first storage space in a lower portion of a first area of the lower electrode and into a second storage space in a lower portion of a second area of the lower electrode different from the first area of the lower electrode, while the high frequency power is applied.

The high frequency power may be applied to the lower electrode through a center feed point in the center portion of the lower electrode and to a peripheral feed point in a peripheral area spaced apart from the center portion of the lower electrode, the first area disposed between the center feed point and the peripheral feed point, and the second area disposed between the peripheral feed point and an outer edge of the lower electrode.

According to one or more embodiments described above, the intensity of the standing wave of the electric field is uniform, and thus the substrate may be uniformly treated.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
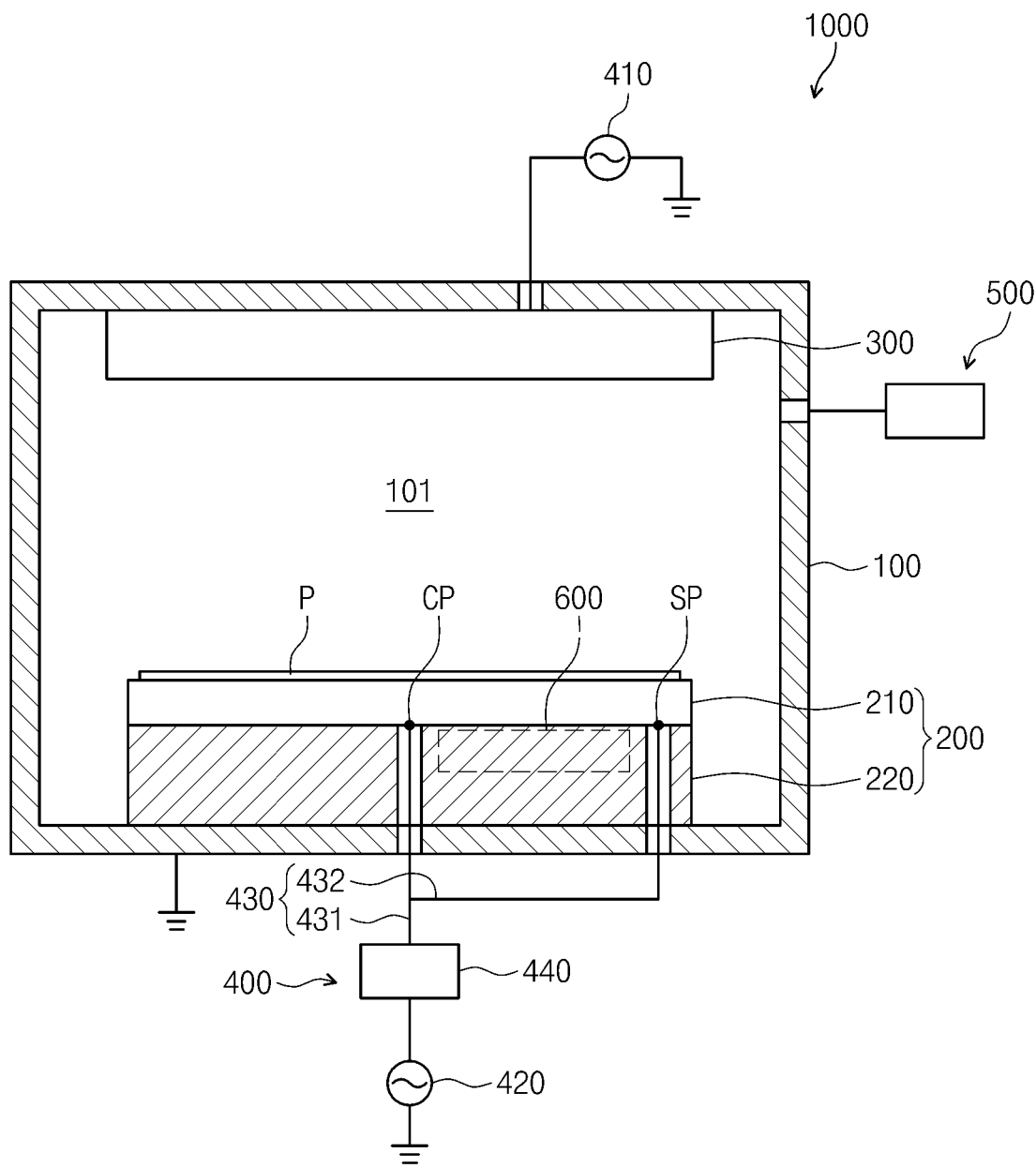
FIG. 1 is a view showing an exemplary embodiment of a substrate-treating apparatus according to the invention.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" with respect to other elements or features would then be oriented "upper" with respect to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

FIG. 1 is a view showing an exemplary embodiment of a substrate-treating apparatus according to the invention.

Referring to FIG. 1, a substrate-treating apparatus 1000 may perform various processes on a substrate P used to manufacture various devices, such as a liquid crystal display ("LCD"), an organic light emitting diode ("OLED"), a solar cell, a semiconductor device, etc. The substrate-treating apparatus 1000 performs various processes using plasma, e.g., a plasma etching process, a plasma chemical vapor deposition process, a sputtering process, etc.

The substrate-treating apparatus 1000 includes a process chamber 100, a substrate supporter 200, an upper electrode 300, a high frequency power supply unit 400, a process gas supply unit 500, and a modulator 600.

The process chamber 100 includes an inner space 101. The inner space 101 of the process chamber 100 is decompressed by a pressure control member (not shown). The inner space 101 of the process chamber 100 may be maintained in a vacuum state while the substrate-treating process is performed. The process chamber 100 may be grounded.

The substrate supporter 200 is placed in the process chamber 100. The substrate supporter 200 includes a lower electrode 210 and a dielectric substance block 220.

The lower electrode 210 has a plate-like shape having a planar area equal to or larger than that of the substrate P and includes a conductive material, such as aluminum (Al). The lower electrode 210 supports the substrate P.

The dielectric substance block 220 is disposed under the lower electrode 210. The dielectric substance block 220 has a planar area corresponding to that of the lower electrode 210 and is placed on a bottom surface of the process chamber 100. As used herein, "corresponding" may indicate being substantially similar in dimension and/or location with respect to another element. The dielectric substance block 220 includes a material having high dielectric constant, and the process chamber 100 and the lower electrode 210 are electrically insulated from each other by the dielectric substance block 220.

The upper electrode 300 is disposed on and facing the lower electrode 210. The upper electrode 300 has a plate-like shape having a planar area corresponding to that of the lower electrode 210 and includes a conductive material.

The high frequency power supply unit 400 applies a high frequency power to the lower electrode 210 and to the upper electrode 300. Due to the high frequency power applied to the lower electrode 210 and the upper electrode 300, an electric field is generated between the lower electrode 210 and the upper electrode 300. The electric field excites a process gas, which is supplied into the inner space 101 of the process chamber 100, to a plasma state. The high frequency power supply unit 400 includes an upper power supply 410, a lower power supply 420 and a high frequency supply line 430.

The upper power supply 410 is electrically connected to the upper electrode 300 and applies the high frequency power to the upper electrode 300. The lower power supply 420 is electrically connected to the lower electrode 210 through the high frequency supply line 430. The lower power supply 420 applies the high frequency power to the lower electrode 210. An impedance matching unit 440 may be provided between the lower electrode 210 and the lower power supply 420.

The high frequency supply line 430 provides a power supply point on a lower surface of the lower electrode 210. As shown in FIG. 1, for example, power supply points (otherwise referred to as "feed points") CP and SP are on a lower surface of the lower electrode 210, but the invention is not limited thereto or thereby. The high frequency supply line 430 includes a first supply line 431 and a second supply line 432. The first supply line 431 provides a feed point CP at a center portion of the lower electrode 210. The second supply line 432 is connected to the first supply line 431 and provides a feed point SP, which is spaced apart from the center portion of the lower electrode 210, to a peripheral portion of the lower electrode 210. Hereinafter, the feed point provided by the first supply line 431 is referred to as a center feed point CP and the feed point provided by the second supply line 432 is referred to as a peripheral feed point SP. In FIG. 1, one peripheral feed point SP has been shown, but it should not be limited thereto or thereby. That is, the peripheral feed point SP may be provided in a plural number in the peripheral portion of the lower electrode.

The process gas supply unit 500 supplies the process gas into the process chamber 100. The process gas is provided into the inner space 101 between the lower electrode 210 and the upper electrode 210 and excited to the plasma state by the electric field.

The modulator 600 is disposed under the lower electrode 210. The modulator 600 changes an average dielectric constant of a surface of the lower electrode 210. The modulator 600 asymmetrically provides a dielectric substance with reference to the center of the lower electrode 210. The high frequency applied to the lower electrode 210 through the high frequency supply line 430 is transmitted along the surface of the lower electrode 210. The high frequency is transmitted to the upper surface of the lower electrode 210 along the lower surface of the lower electrode 210. The modulator 600 changes the magnitude of the wavelength of the high frequency, and the transmission distance of the high frequency. This causes a movement of a peak position of a standing wave generated between the lower electrode 210 and the upper electrode 300.

Figure 2:
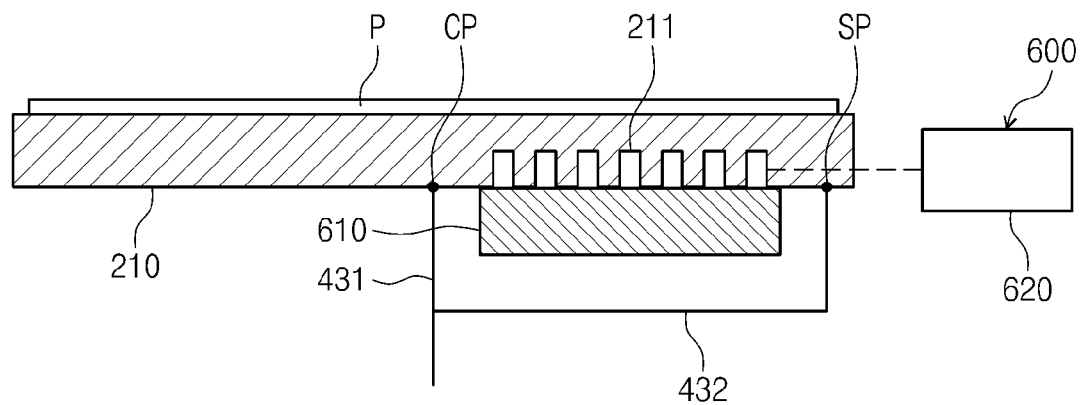
FIG. 2 is a view showing an exemplary embodiment of a modulator according to the invention.

FIG. 2 is a view showing an exemplary embodiment of a modulator according to the invention.

Referring to FIG. 2, one or more trenches 211 are recessed into an inner space of the lower electrode 210 from the lower surface of the lower electrode 210. The trenches 211 are in one side area with reference to the center portion of the lower electrode 210. The trenches 211 are spaced apart from each other at predetermined intervals in a direction from the center portion of the lower electrode 210 to the peripheral portion of the lower electrode 210. The trenches 211 may be disposed between the center feed point CP and the peripheral feed point SP.

The modulator 600 includes an insulating plate 610 and a dielectric substance supply unit 620 (hereinafter referred to as "dielectric fluid supply unit"). The insulating plate 610 includes an insulating material and is coupled with the lower surface of the lower electrode 210. The trenches 211 are used as spaces which accommodate fluids therein. The insulating plate 610 may be grounded.

The dielectric fluid supply unit 620 supplies the dielectric substance in a fluid state to the trenches 211 and withdraws the dielectric substance accommodated in the trenches 211. The dielectric substance may be a liquefied metal, such as mercury (Hg), or a liquid or gas having high dielectric constant, such as air. The dielectric fluid supply unit 620 supplies the dielectric substance into the trenches 211 while the high frequency power is applied to the lower electrode 210 and withdraws the dielectric substance in the trenches 211.

Figure 3:
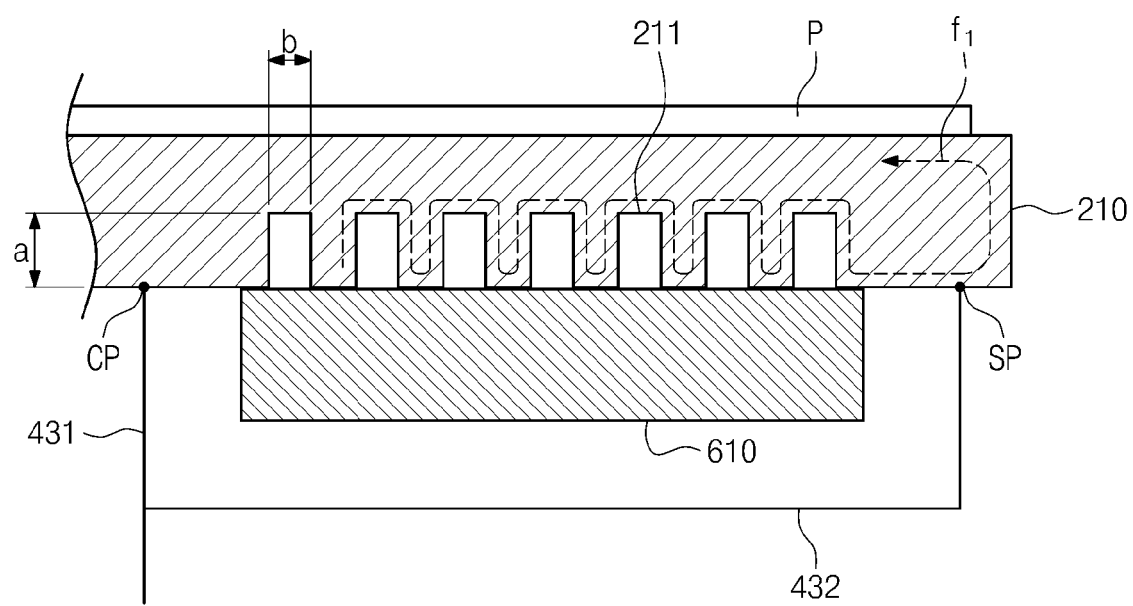
FIG. 3 is a view showing trenches to which a dielectric substance is not provided.
Figure 4:
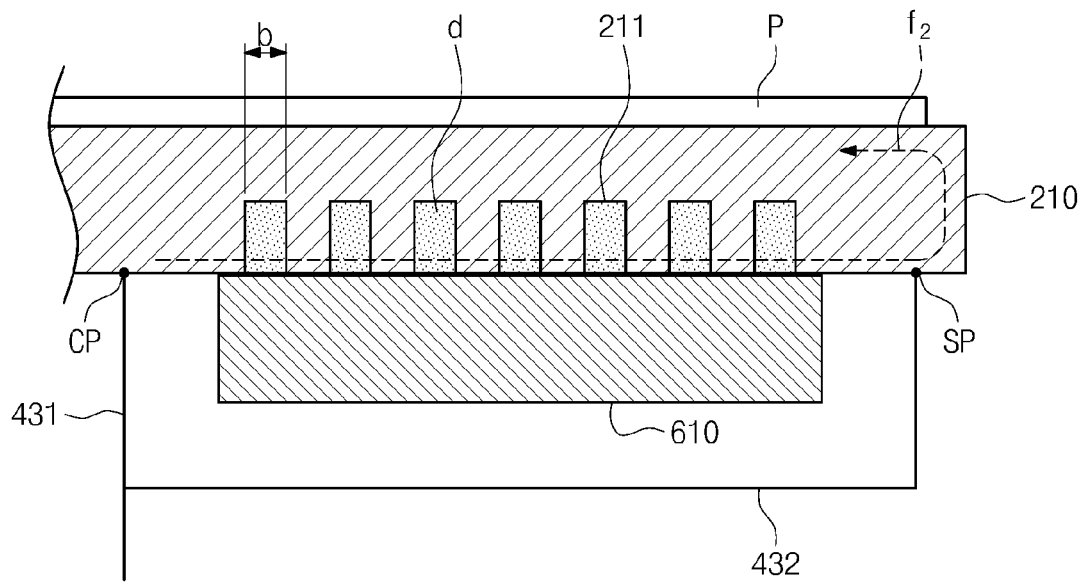
FIG. 4 is a view showing trenches to which a dielectric substance is provided.

FIG. 3 is a view showing the trenches to which the dielectric substance is not provided and FIG. 4 is a view showing the trenches to which the dielectric substance is provided.

Referring to FIG. 3, the high frequency f1 is transmitted along the lower surface of the lower electrode 210. The high frequency f1 is transmitted along the shape of the trenches 211 when passing through areas including the trenches 211. An effective transmission distance D1 of the high frequency f1 when the high frequency f1 passes through one trench is represented by the following equation D1=2×a+b, where 'a' denotes a depth of the trench and 'b' denotes a width of the trench.

Referring to FIG. 4, in the case that the dielectric substance d is supplied into the trenches 211, a high frequency f2 is transmitted passing through the trenches 211. Thus, an effective transmission distance D2 of the high frequency f2 corresponds to the width b of the one trench when the high frequency f2 passes through the one trench.

As described above, the effective transmission distance D1 when the dielectric substance d is not supplied into the trenches 211 is longer than the effective transmission distance D2 when the dielectric substance d is supplied into the trenches 211. In addition, when the dielectric substance d is supplied into the trenches 211, an amplitude of the high frequency becomes larger and a period of the high frequency becomes shorter than when the dielectric substance d is not supplied into the trenches 211.

A first process in which the dielectric substance d is supplied into the trenches 211 (refer to FIG. 4) and a second process in which the dielectric substance d is not supplied into the trenches 211 (refer to FIG. 3) are alternately repeatedly performed while the high frequency power is applied to the lower electrode 210.

Figure 5:
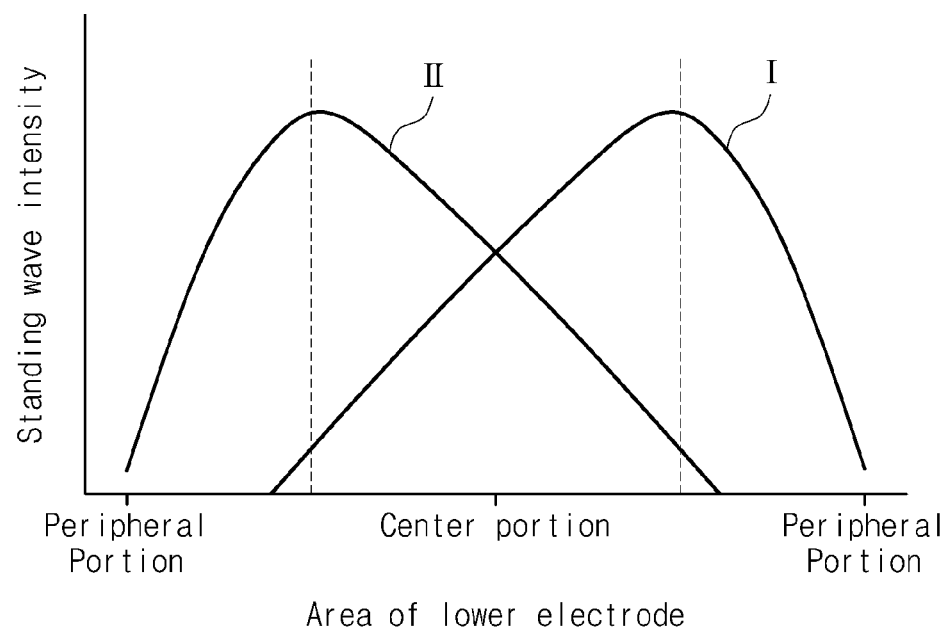
FIG. 5 is a graph showing an intensity of a standing wave generated in FIGS. 3 and 4.

FIG. 5 is a graph showing an intensity of a standing wave generated in FIGS. 3 and 4.

Referring to FIG. 5, a horizontal axis of the graph represents an area of the lower electrode 210 and a vertical axis of the graph represents the intensity of the standing wave. A first graph I represents the intensity of the standing wave generated in the case that the dielectric substance d is not supplied into the trenches 211 as shown in FIG. 3 and a second graph II represents the intensity of the standing wave generated in the case that the dielectric substance d is supplied into the trenches 211 as shown in FIG. 4. As represented by the first and second graphs I and II, the position at which the peak of the standing wave is formed, is changed according to the supply of the dielectric substance d. Since the first process and the second process are alternately repeatedly performed, the position of the peak of the standing wave is continuously changed. The continuous change of the position of the peak of the standing wave allows the intensity of the standing wave of the electric field to be substantially uniform over an entire of the area of the lower electrode 210, so that the substrate P may be uniformly treated.

Figure 6:
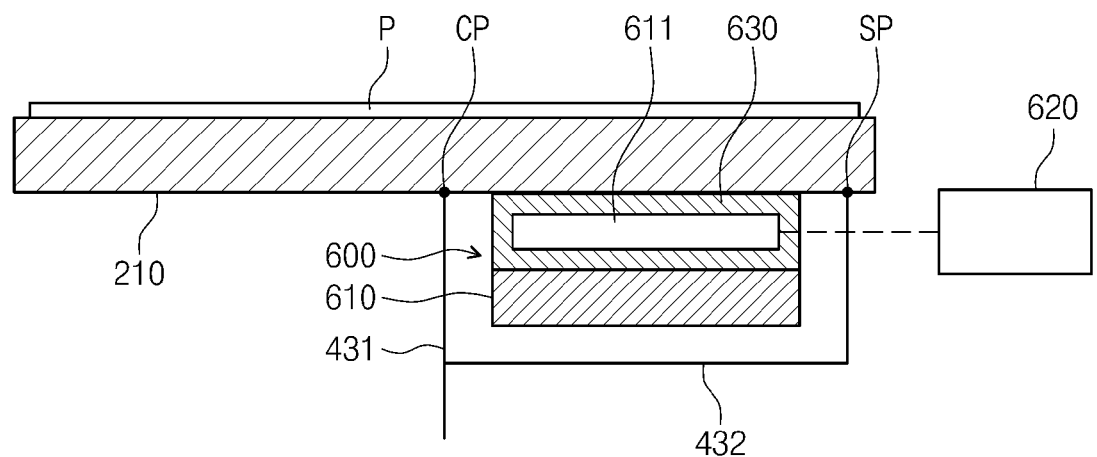
FIGS. 6 and 7 are views showing another exemplary embodiment of a modulator according to the invention.
Figure 7:
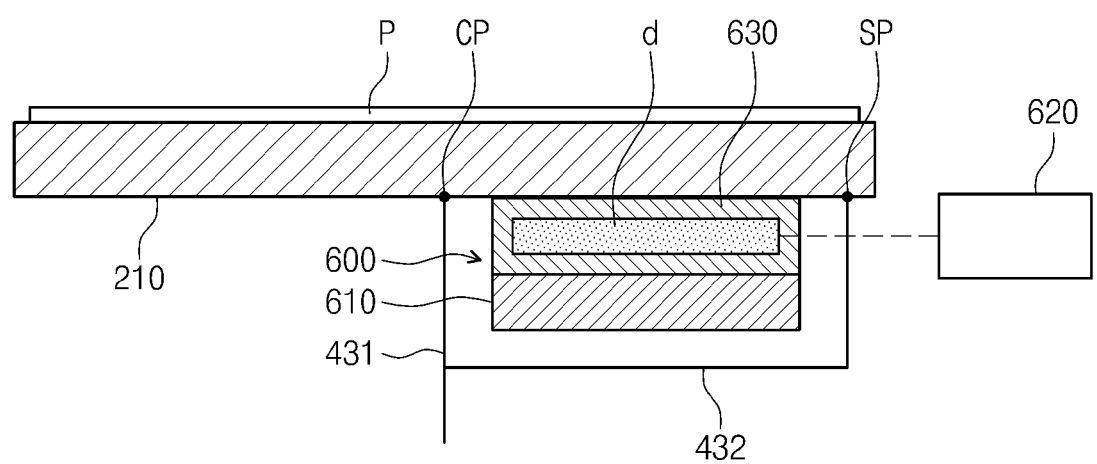

FIGS. 6 and 7 are views showing another exemplary embodiment of a modulator according to the invention.

Referring to FIGS. 6 and 7, a modulator 600 includes a block 630, an insulating plate 610, and a dielectric fluid supply unit 620.

The block 630 is disposed under the lower electrode 210 between the center feed point CP and the peripheral feed point SP. The block 630 is coupled to the lower surface of the lower electrode 210. The block 630 may include a material having high dielectric constant. The block 630 is provided with a storage space 611 defined therein, where material of the block 630 is omitted or absent. The insulating plate 610 is coupled to a lower surface of the block 630. The insulating plate 610 is grounded.

The dielectric fluid supply unit 620 supplies the dielectric substance d in the fluid state into the storage space 611 of the block 630 and withdraws the dielectric substance d stored in the storage space 611. The dielectric fluid supply unit 620 performs a first process that supplies the dielectric substance d into the storage space 611 as shown in FIG. 7 and a second process that withdraws the dielectric substance d from the storage space 611 as shown in FIG. 6 while the high frequency power is applied to the lower electrode 210. The first process and the second process are alternately repeatedly performed. Due to the first process and the second process, the average dielectric constant of the surface of the lower electrode 210 is changed. The average dielectric constant in the area of the lower electrode 210, to which the block 630 is coupled, is represented higher during the first process than that during the second process. The change of the average dielectric constant causes variation in the characteristics of the high frequency transmitted along the lower surface of the lower electrode 210. The variation in the characteristics of the high frequency causes the movement of the peak position of the standing wave, and thus the intensity of the standing wave becomes uniform according to the area of the lower electrode 210, to thereby uniformly treat the substrate P.

Figure 8:
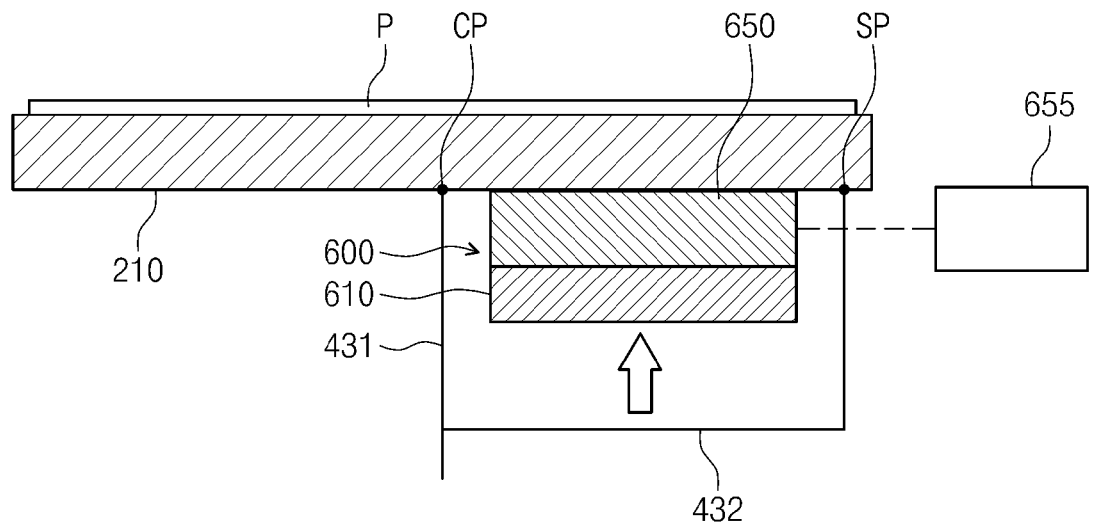
FIGS. 8 and 9 are views showing another exemplary embodiment of a modulator according to the invention.
Figure 9:
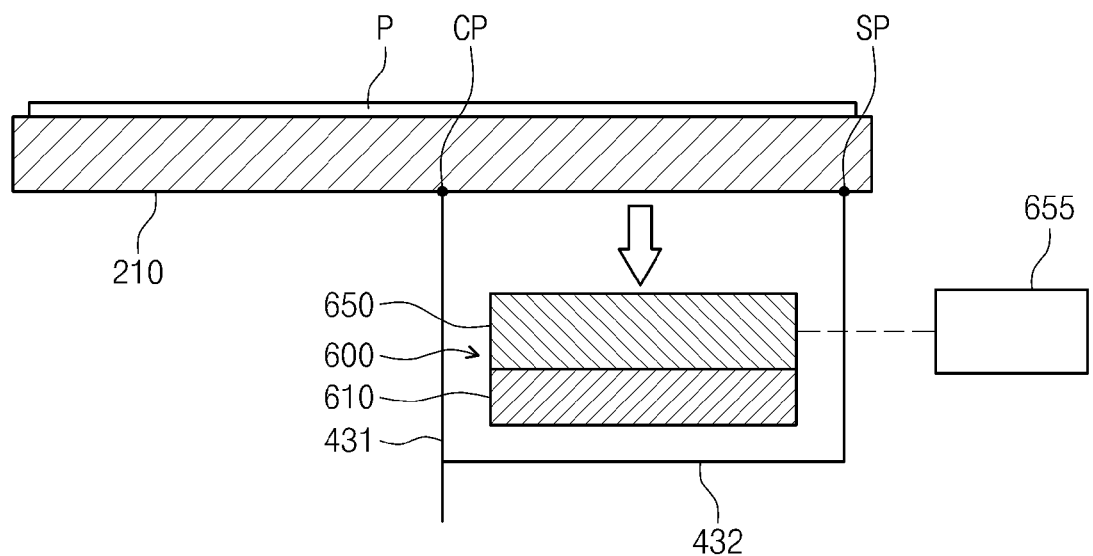

FIGS. 8 and 9 are views showing another exemplary embodiment of a modulator according to the invention.

Referring to FIGS. 8 and 9, a modulator 600 includes a dielectric substance block 650, an insulating plate 610 and a dielectric substance block moving unit 655.

The dielectric substance block 650 is disposed under the lower electrode 210 between the center feed point CP and the peripheral feed point SP. The dielectric substance block 650 includes a material having high dielectric constant. The dielectric substance block 650 may be a substantially solid and continuous member, where the block 630 may be a non-solid member as including the storage space 611 therein, but the invention is not limited thereto or thereby. The insulating plate 610 is coupled to a lower surface of the dielectric substance block 650. The insulating plate 610 is grounded.

The dielectric substance block moving unit 655 moves the dielectric substance block 650 up and down as indicated by the arrows in FIGS. 8 and 9, to change a distance between the lower electrode 210 and the dielectric substance block 650. The dielectric substance block moving unit 655 moves the dielectric substance block 650 to alternately repeatedly perform a first process in which the dielectric substance block 650 makes contact with the lower electrode 210 (refer to FIG. 8) and a second process in which the dielectric substance block 650 is spaced apart from the lower electrode 210 (refer to FIG. 9). Due to the first process and the second process, the average dielectric constant of the surface of the lower electrode 210 is changed. The average dielectric constant in the area of the lower electrode 210, in which the dielectric substance block 650 makes contact with the lower electrode 210, is represented higher during the first process than that during the second process. The change of the average dielectric constant causes variation in the characteristics of the high frequency transmitted along the lower surface of the lower electrode 210. The variation in the characteristics of the high frequency causes the movement of the peak position of the standing wave, and thus the intensity of the standing wave becomes uniform according to the area of the lower electrode 210, thereby uniformly treating the substrate P.

FIGS. 10 to 20 are views illustrating various exemplary embodiments of a method of changing an average dielectric constant of a lower electrode according to the invention. The views shown in FIGS. 10 to 20 are plan views when viewed from a lower side of the lower electrode 210.

Figure 10:
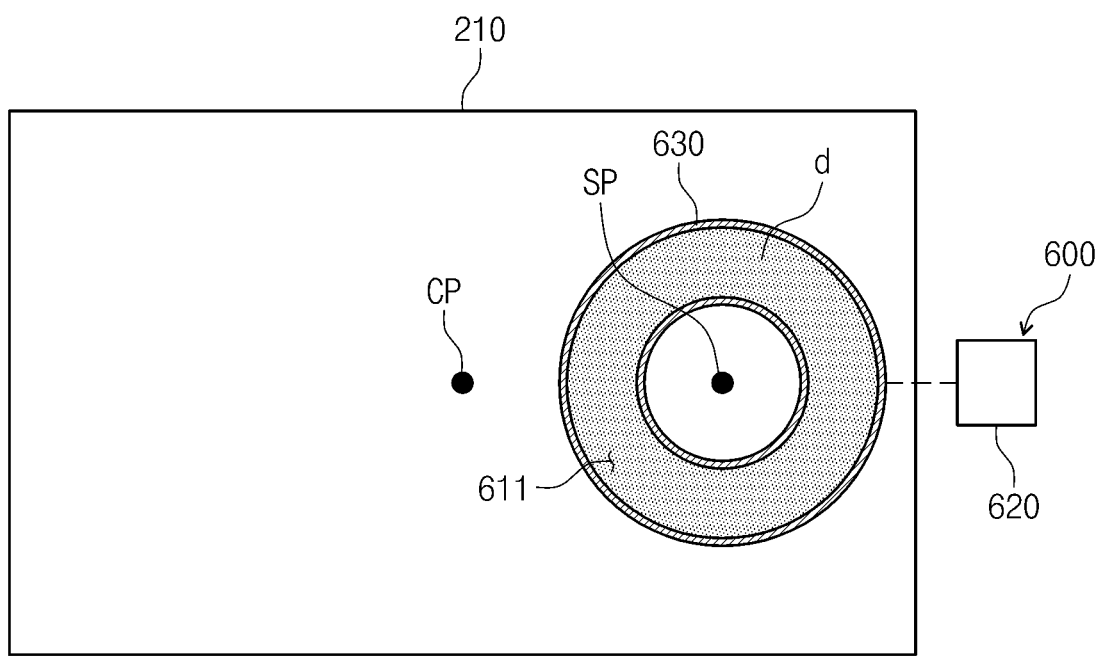
FIGS. 10 to 20 are views illustrating various an exemplary embodiments of a method of changing an average dielectric constant of a lower electrode according to the invention.

Referring to FIG. 10, a modulator 600 includes a block 630 and a dielectric fluid supply unit 620. The block 630 has a ring shape in a plan view to surround a peripheral feed point SP, such as having the peripheral feed point SP at the ring's center. The block 630 is provided with a storage space 611 extending along a circumference of an inner portion of the block 630, such as having the peripheral feed point SP as an axis thereof. The dielectric fluid supply unit 620 supplies a dielectric substance d in a fluid state into the storage space 611 of the block 630 and withdraws the dielectric substance d stored in the storage space 611.

Figure 11:
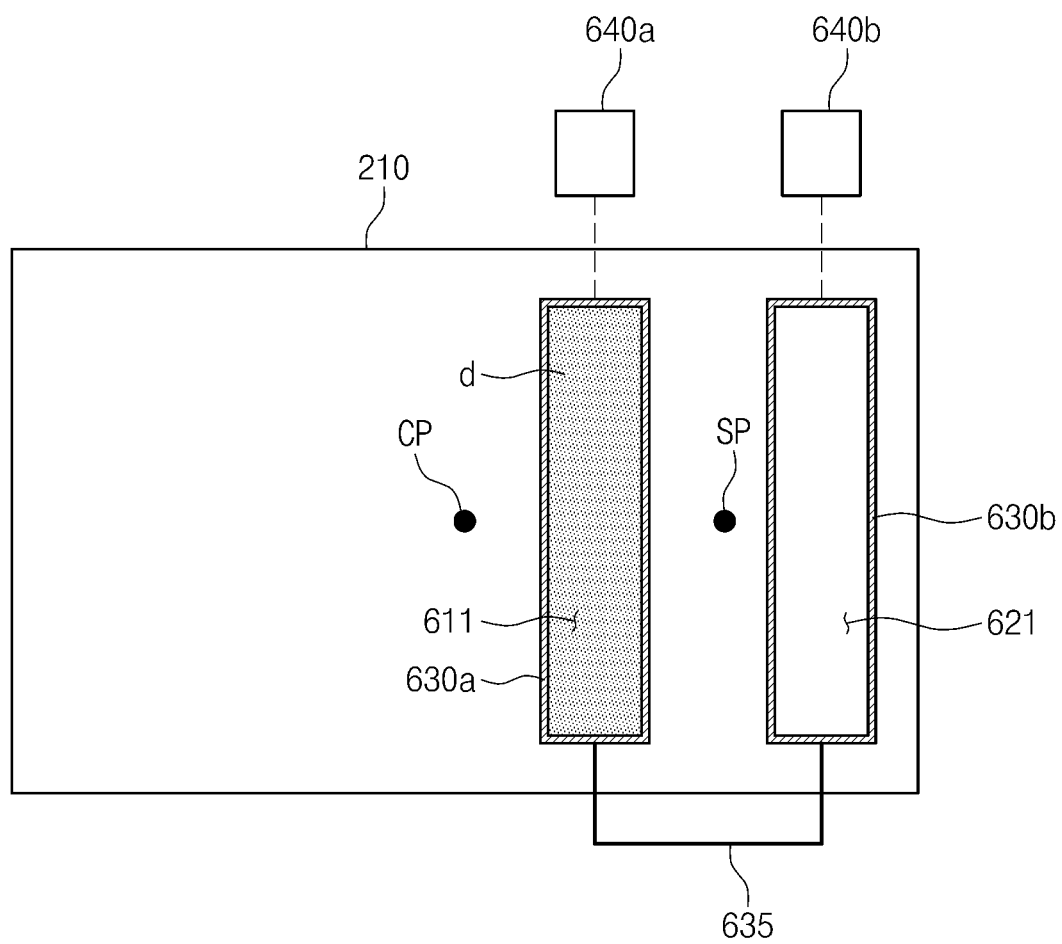

Referring to FIG. 11, a modulator 600 includes a first block 630a, a second block 630b, a connection line 635, and fluid transfer units 640a and 640b. The first block 630a and the second block 630b are disposed under the lower electrode 210. The first block 630a is disposed under a first area of the lower electrode 210 and the second block 630b is disposed under a second area of the lower electrode 210. The first area and the second area are different and/or separated from each other. The first area is positioned between the center feed point CP and the peripheral feed point SP, and the second area is positioned between the peripheral feed point SP and an outer edge of the lower electrode 210. Each of the first and second blocks 630a and 630b has a rectangular shape and is arranged with longitudinal axes of the first and second blocks 630a and 630b being parallel to each other. The first block 630a is provided with a first storage space 611 defined therein and the second block 630b is provided with a second storage space 621 defined therein. The first and second storage spaces 611 and 621 store the dielectric substance d in the fluid state therein.

The connection line 635 connects the first storage space 611 and the second storage space 621 to each other. The dielectric substance d stored in one of the first and second storage spaces 611 and 621 moves to the other one of the first and second storage spaces 611 and 621 via the connection line 635. As used herein "connect" may indicate a physical, electrical and/or fluid connection.

The fluid transfer units 640a and 640b affect a transfer the dielectric substance d between the first storage space 611 and the second storage space 621. The fluid transfer unit may also supply and/or withdraw the dielectric substance d to and from the storage space, but the invention is not limited thereto or thereby. The fluid transfer units 640a and 640b include a first transfer unit 640a and a second transfer unit 640b. The first transfer unit 640a is connected to the first storage space 611 and, for example, sprays gas into the first storage space 611. The gas includes air and/or inert gas. The gas sprayed into the first storage space 611 pushes out the dielectric substance d stored in the first storage space 611, and thus the dielectric substance d moves to the second storage space 621 through the connection line 635. The second transfer unit 640b is connected to the second storage space 621 and, for example, sprays the gate into the second storage space 621. The gas sprayed into the second storage space 621 pushes out the dielectric substance d stored in the second storage space 621, and thus the dielectric substance d moves to the first storage space 611 through the connection line 635. When the first transfer unit 640a and the second transfer unit 640b alternately sprays the gas, the dielectric substance d stored in one of the first and second storage spaces 611 and 621 may move to the other one of the first and second storage spaces 611 and 621, respectively.

The dielectric substance d changes the average dielectric constant of the surface of the lower electrode 210. In addition, the movement of the dielectric substance d changes the area in which the average dielectric constant is changed. The changes of the average dielectric constant and the area, in which the average dielectric constant is changed, causes variation in the characteristics of the high frequency transmitted along the lower surface of the lower electrode 210. The variation in the characteristics of the high frequency causes the movement of the peak position of the standing wave, and thus the intensity of the standing wave becomes uniform according to the area of the lower electrode 210, thereby uniformly treating the substrate P.

Figure 12:
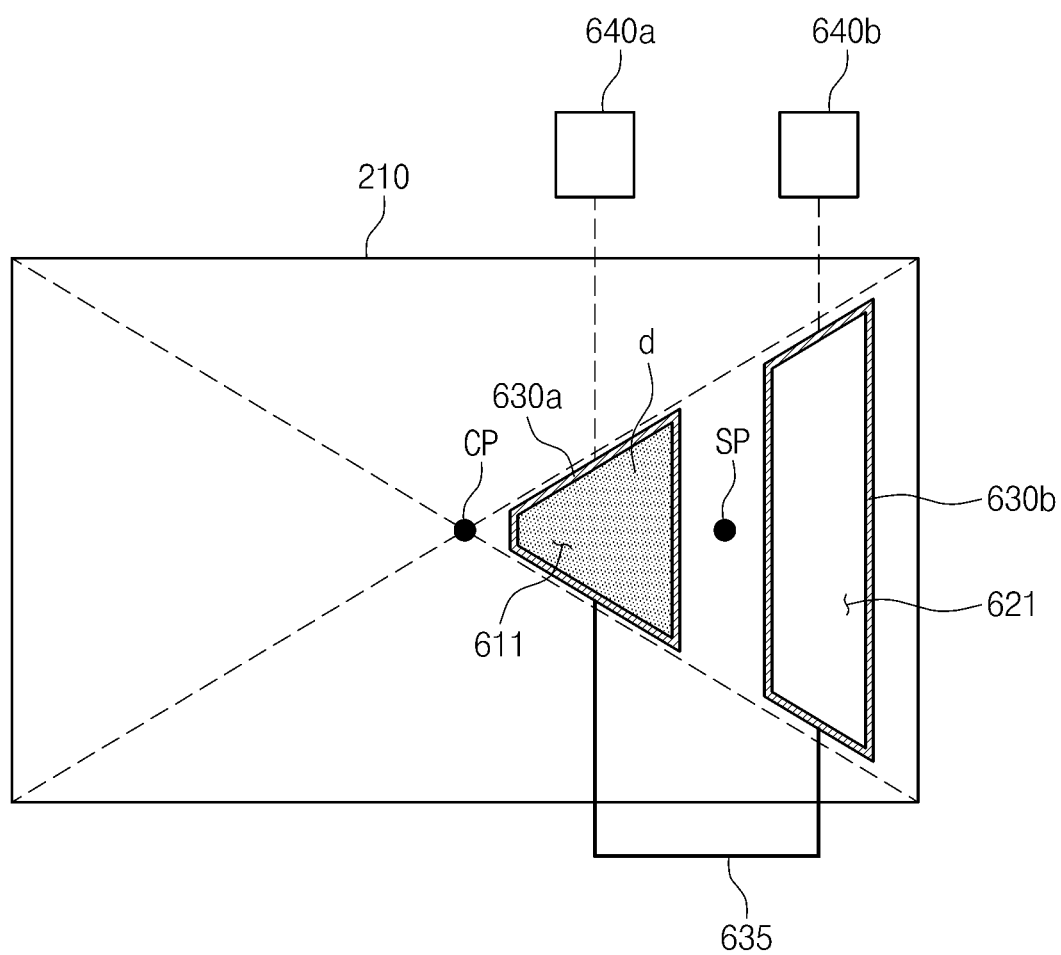

Referring to FIG. 12, each of the first block 630a and the second block 630b has a trapezoid shape in a plan view. Two sides of each of the first and second blocks 630a and 630b are collinear with virtual diagonal lines (indicated as dotted lines) crossing each other at the center of the lower electrode 210. The dielectric substance d may be selectively stored in the first storage space 611 and the second storage space 621 by the first and second transfer units 640a and 640b. Since the first block 630a and the second block 630b have different shapes from each other, the area of the lower electrode 210 in which the average dielectric constant is changed may be formed in various shapes with respect to a total area of the lower electrode 210. The difference in shape between the first block 630a and the second block 630b causes variation in the characteristics of the high frequency transmitted along the lower surface of the lower electrode 210.

Figure 13:
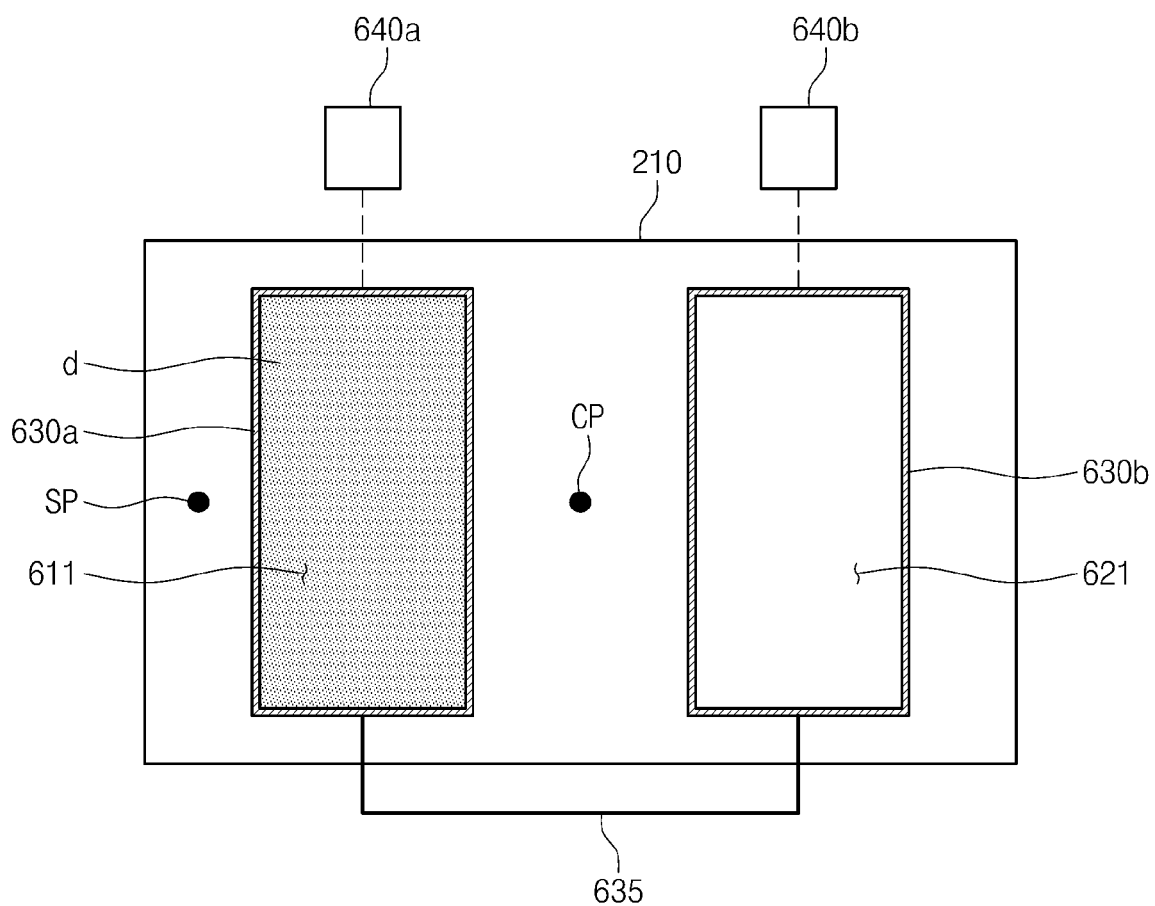

Referring to FIG. 13, the first block 630a and the second block 630b are positioned at opposing sides of the center feed point CP, respectively. A peripheral feed point SP is arranged along a circumference of the center feed point CP such that the first block 630a is disposed between the center feed point CP and the peripheral feed point SP. The dielectric substance d may be selectively stored in the first storage space 611 of the first block 630a and the second storage space 621 of the second block 630b by the first and second transfer units 640a and 640b. Accordingly, the area of the lower electrode 210, in which the average dielectric constant is changed, may be alternately represented in both sides of the center feed point CP.

Figure 14:
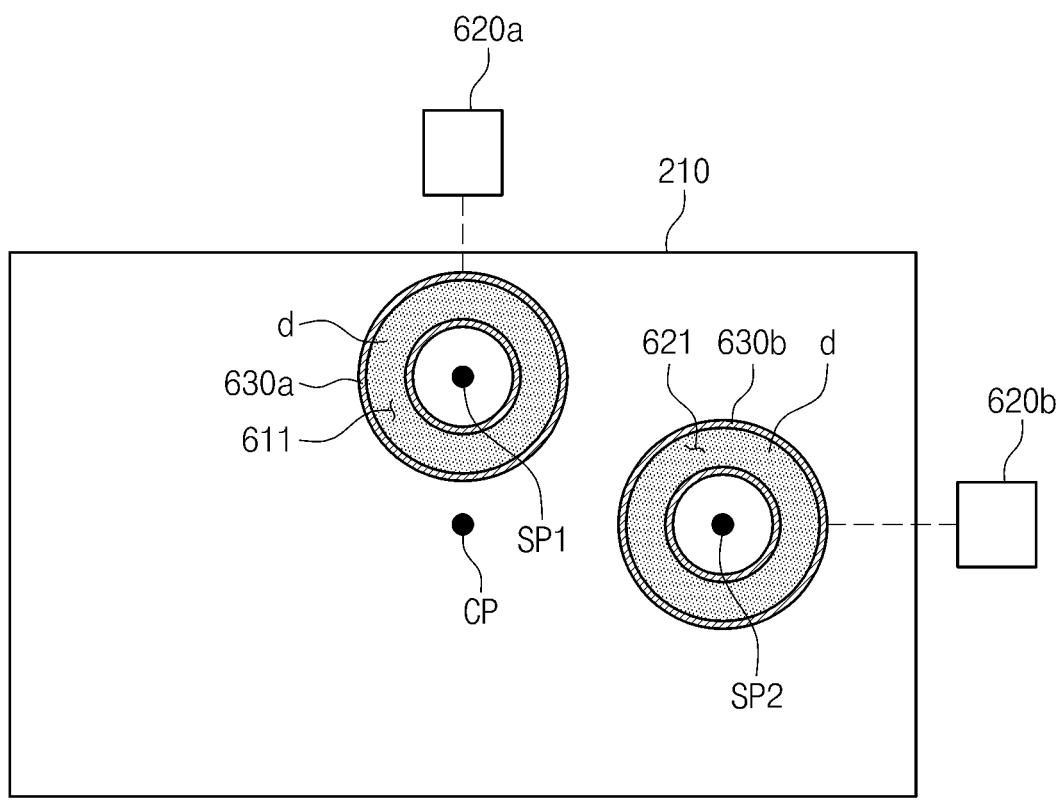

Referring to FIG. 14, one center feed point CP and two peripheral feed points SP1 and SP2 are at the lower surface of the lower electrode 210. First and second peripheral feed points SP1 and SP2 are respectively in positions such that virtual lines from the first and second peripheral feed points SP1 and SP2, to the one center feed point CP, form a right angle with each other at the center feed point CP. The first block 630a and/or the second block 630b have a ring shape in a plan view and are provided with first and second storage spaces 611 and 621, respectively. The first block 630a is disposed to surround the first peripheral feed point SP1, such as having the first peripheral feed point SP1 at the ring's center, and the second block 630b is disposed to surround the second peripheral feed point SP2, such as having the second peripheral feed point SP2 at the ring's center. A first dielectric fluid supply unit 620a supplies the dielectric substance d into the first storage space 611 and withdraws the dielectric substance d stored in the first storage space 611. A second dielectric fluid supply unit 620b supplies the dielectric substance d into the second storage space 621 and withdraws the dielectric substance d stored in the second storage space 621. The supply of the dielectric substance d into the first and second storage spaces 611 and 621 and the withdrawal of the dielectric substance d from the first and second storage spaces 611 and 621 may be substantially simultaneously performed or alternately performed with each other.

Figure 15:
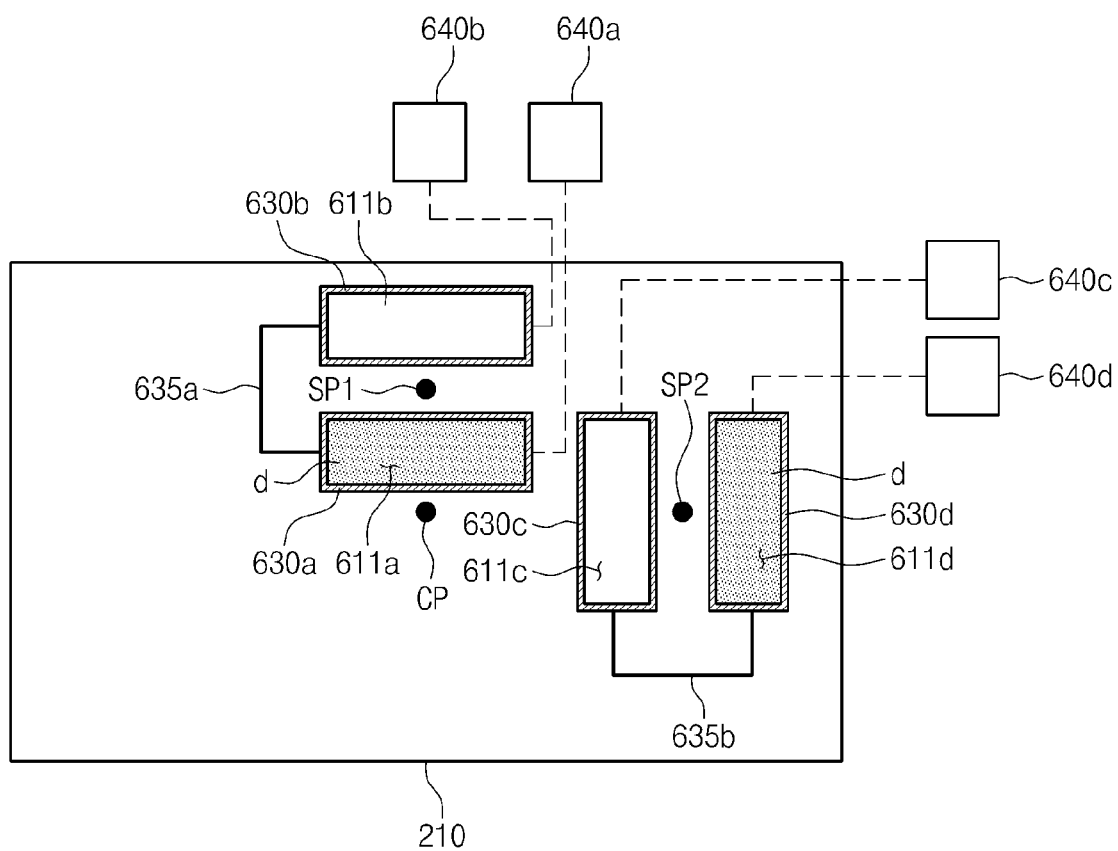

Referring to FIG. 15, a first peripheral feed point SP1 and a second peripheral feed point SP2 are in positions such that virtual lines from the first and second peripheral feed points SP 1 and SP2, to the one center feed point CP, form a right angle with each other at a center feed point CP. A first block 630a is positioned between the center feed point CP and the first peripheral feed point SP1 and a second block 630b is positioned between the first peripheral feed point SP1 and an outer edge of the lower electrode 210. A first storage space 611a of the first block 630a and a second storage space 611b of the second block 630b are connected to each other by a first connection line 635a. The dielectric substance d moves between the first storage space 611a and the second storage space 611b by first and second transfer units 640a and 640b.

A third block 630c is positioned between the center feed point CP and the second peripheral feed point SP2 and a fourth block 630d is positioned between the second peripheral feed point SP2 and the outer edge of the lower electrode 210. A third storage space 611c of the third block 630c and a fourth storage space 611d of the fourth block 630d are connected to each other by a second connection line 635b. The dielectric substance d moves between the third storage space 611c and the fourth storage space 611d by third and fourth transfer units 640c and 640d.

Figure 16:
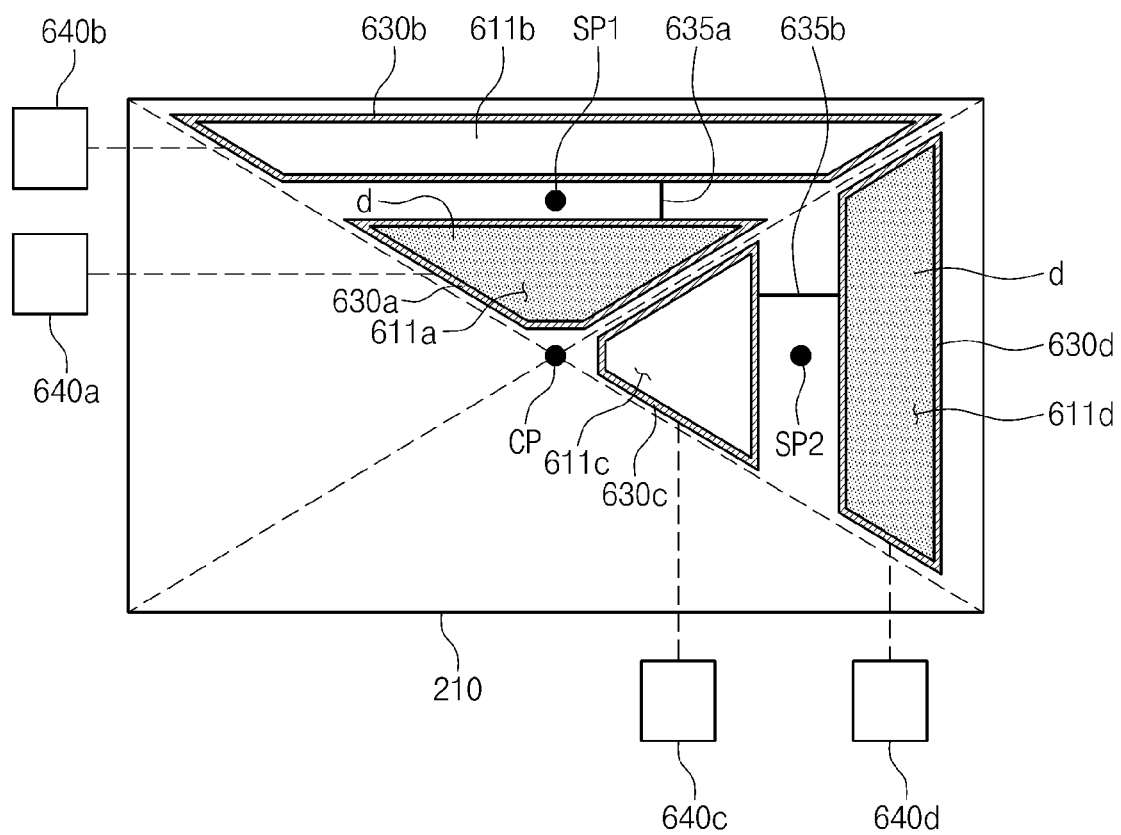

Referring to FIG. 16, each of first, second, third, and fourth blocks 630a, 630b, 630c, and 630d has a trapezoid shape. The first block 630a is disposed between a center feed point CP and a first peripheral feed point SP1 and a second block 630b is disposed between the first peripheral feed point SP1 and an outer edge of the lower electrode 210. Two sides of each of the first and second blocks 630a and 630b are collinear with virtual diagonal lines crossing each other at the center of the lower electrode 210. The third block 630c is disposed between the center feed point CP and the second peripheral feed point SP2 and the fourth block 630d is disposed between the second peripheral feed point SP2 and the outer edge of lower electrode 210. Two sides of each of the third and fourth blocks 630c and 630d are collinear with virtual diagonal lines crossing each other at the center of the lower electrode 210. A first storage space 611a of the first block 630a and a second storage space 611b of the second block 630b are connected to each other by a first connection line 635a, and a third storage space 611c of the third block 630c and a fourth storage space 611d of the fourth block 630d are connected to each other by a second connection line 635b.

The dielectric substance d is stored in one of the first storage space 611a of the first block 630a and the second storage space 611b of the second block 630b, and the dielectric substance d moves to the other one of the first storage space 611a of the first block 630a and the second storage space 611b of the second block 630b by first and second transfer units 640a and 640b. In addition, the dielectric substance d is stored in one of the third storage space 611c of the third block 630c and the fourth storage space 611d of the fourth block 630d, and the dielectric substance d moves to the other one of the third storage space 611c of the third block 630c and the fourth storage space 611d of the fourth block 630d by third and fourth transfer units 640c and 640d.

Figure 17:
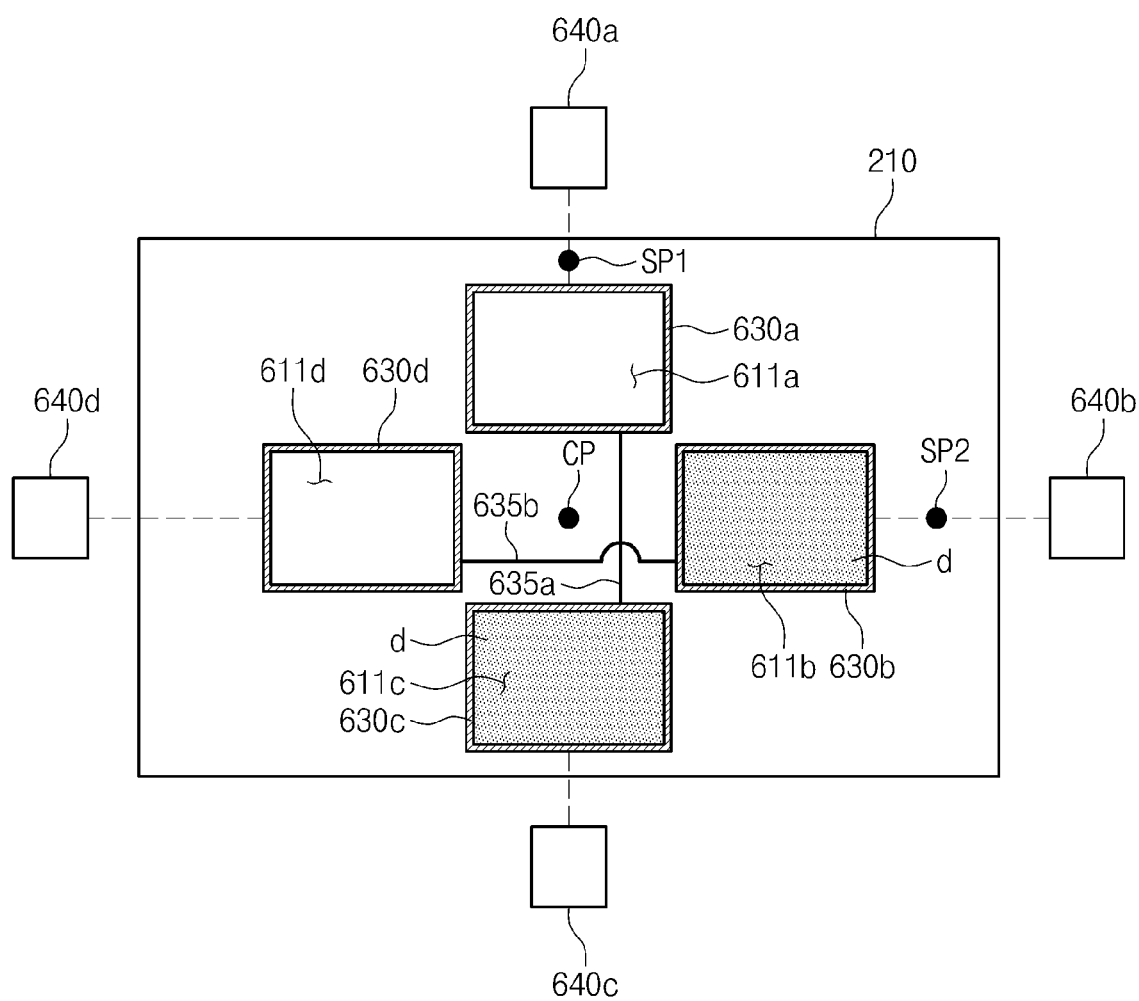

Referring to FIG. 17, a first block 630a is disposed to face a third block 630c while interposing the center feed point CP therebetween, and a second block 630b is disposed to face a fourth block 630d while interposing the center feed point CP therebetween. A first peripheral feed point SP1 and a second peripheral point SP2 are arranged along a circumference of the center feed point CP. The first block 630a is disposed between the center feed point CP and the first peripheral feed point SP1, and the second block 630b is disposed between the center feed point CP and the second peripheral feed point SP2. The first to fourth blocks 630a to 630d are arranged in a cross shape with the center feed point CP as its center. A first inner space 611a of the first block 630a and a third inner space 611c of the third block 630c are connected to each other by a first connection line 635a, and a second inner space 611b of the second block 630b and a fourth inner space 611d of the fourth block 630d are connected to each other by a second connection line 635b. When first and third transfer units 640a and 640c are alternately operated to spray gas, the dielectric substance d stored in one of the first inner space 611a and the third inner space 611c may move to the other one of the first inner space 611a and the third inner space 611c. In addition, when second and fourth transfer units 640b and 640d are alternately operated to spray gas, the dielectric substance d stored in one of the second inner space 611b and the fourth inner space 611d may move to the other one of the second inner space 611b and the fourth inner space 611d.

Figure 18:
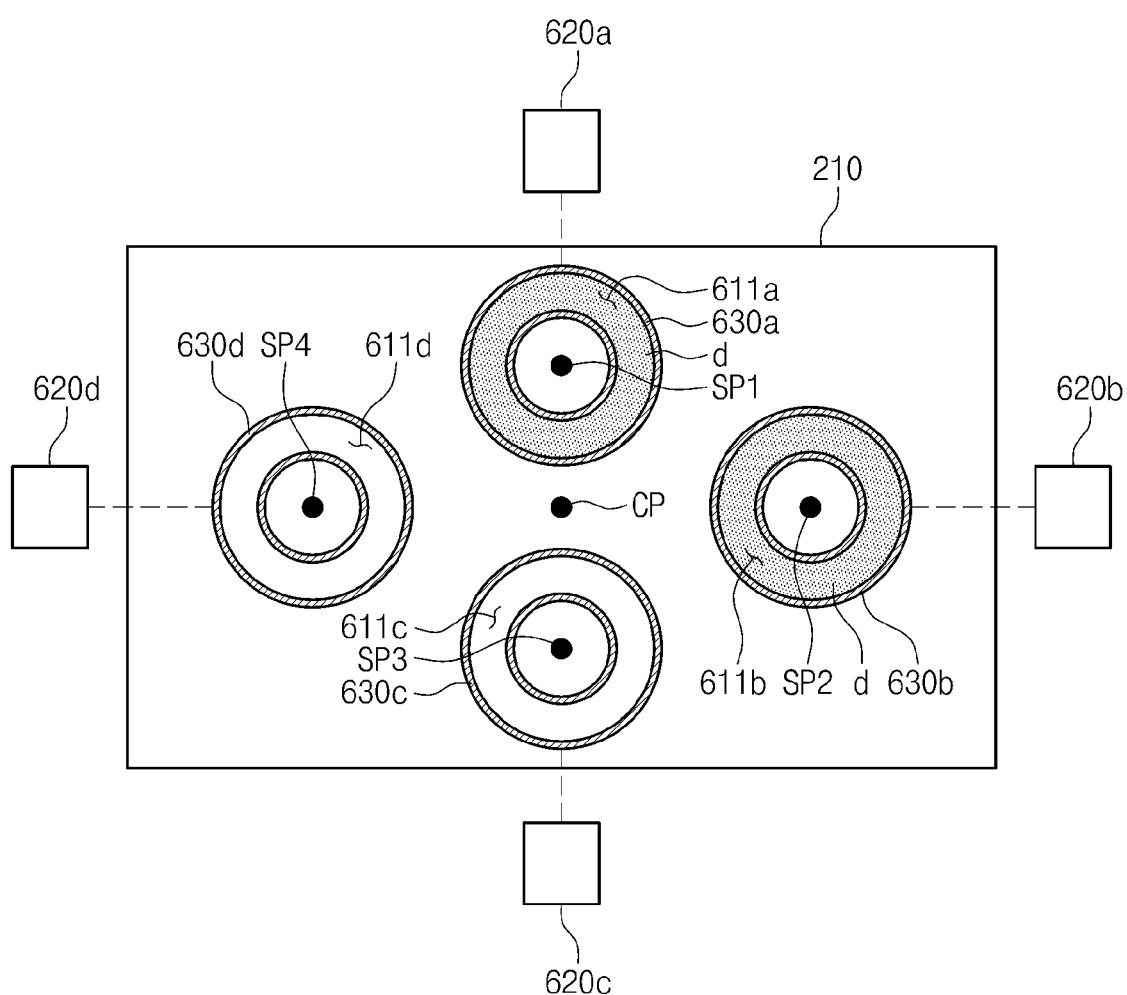

Referring to FIG. 18, four peripheral feed points SP1, SP2, SP3, and SP4 are on the lower surface of the lower electrode 210. The peripheral feed points SP1 to SP4 are provided to surround a center feed point CP, and respective virtual lines connecting two peripheral feed points adjacent to each other of the peripheral feed points SP1 to SP4, form a right angle with each other at the center feed point CP. Each of first to fourth blocks 630a to 630d has a ring shape to surround a corresponding peripheral feed point of the peripheral feed points SP1 to SP4, such as having a respective peripheral feed point SP1 to SP4 at the ring's center. Dielectric fluid supply units 620a to 620d supply the dielectric substance d into first to fourth storage spaces 611a to 611d of the first to fourth blocks 630a to 630d, respectively, and withdraw the dielectric substance d stored in the first to fourth storage spaces 611a to 611d. The supply and withdrawal of the dielectric substance d are substantially simultaneously performed or sequentially performed. In addition, the supply and withdrawal of the dielectric substance d may be substantially simultaneously performed in the unit of two blocks of the first to fourth blocks 630a to 630d.

Figure 19:
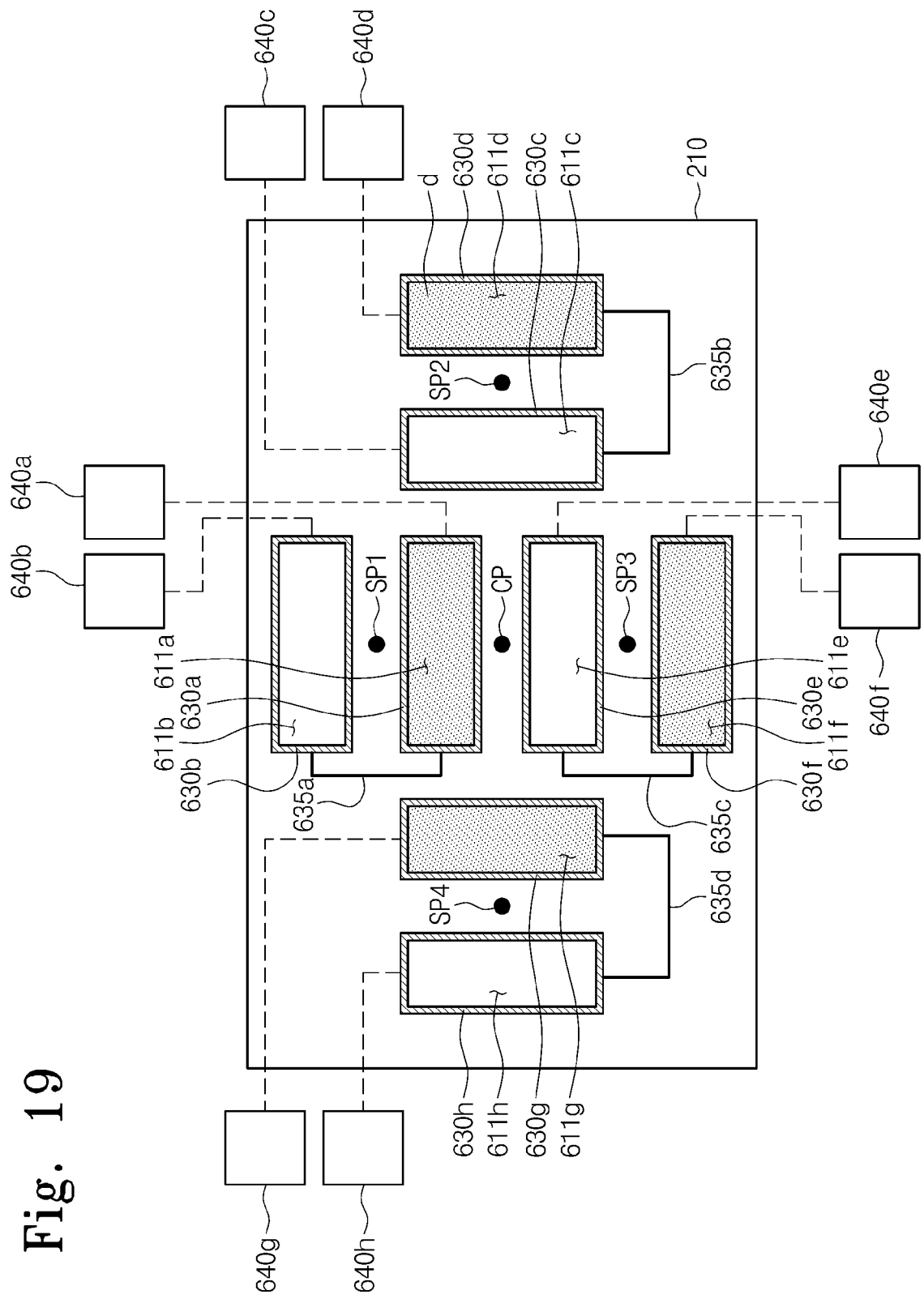

Referring to FIG. 19, four peripheral feed points SP1 to SP4 are on the lower surface of the lower electrode 210. The peripheral feed points SP 1 to SP4 are arranged to surround the center feed point CP, and virtual lines connecting two peripheral feed points adjacent to each other of the peripheral feed points SP1 to SP4, to the center feed point CP, form a right angle with each other at the center feed point CP.

A first block 630a is disposed between the center feed point CP and the first peripheral feed point SP1 and a second block 630b is disposed between the first peripheral feed point SP1 and an outer edge of the lower electrode 210. A first storage space 611a of the first block 630a and a second storage space 611b of the second block 630b are connected to each other by a first connection line 635a. The dielectric substance d moves between the first storage space 611a and the second storage space 611b by first and second transfer units 640a and 640b. A third block 630c is disposed between the center feed point CP and the second peripheral feed point SP2 and a fourth block 630d is disposed between the second peripheral feed point SP2 and the outer edge of the lower electrode 210. A third storage space 611c of the third block 630c and a fourth storage space 611d of the fourth block 630d are connected to each other by a second connection line 635b. The dielectric substance d moves between the third storage space 611c and the fourth storage space 611d by third and fourth transfer units 640c and 640d.

A fifth block 630e is disposed between the center feed point CP and the third peripheral feed point SP3 and a sixth block 630f is disposed between the third peripheral feed point SP3 and the outer edge of the lower electrode 210. A fifth storage space 611e of the fifth block 630e and a sixth storage space 611f of the sixth block 630f are connected to each other by a third connection line 635c. The dielectric substance d moves between the fifth storage space 611e and the sixth storage space 611f by fifth and sixth transfer units 640e and 640f. A seventh block 630g is disposed between the center feed point CP and the fourth peripheral feed point SP4 and an eighth block 630h is disposed between the fourth peripheral feed point SP4 and an outer edge of the lower electrode 210. A seventh storage space 611g of the seventh block 630g and an eighth storage space 611h of the eighth block 630h are connected to each other by a fourth connection line 635d. The dielectric substance d moves between the seventh storage space 611g and the eighth storage space 611h by seventh and eighth transfer units 640g and 640h.

Figure 20:
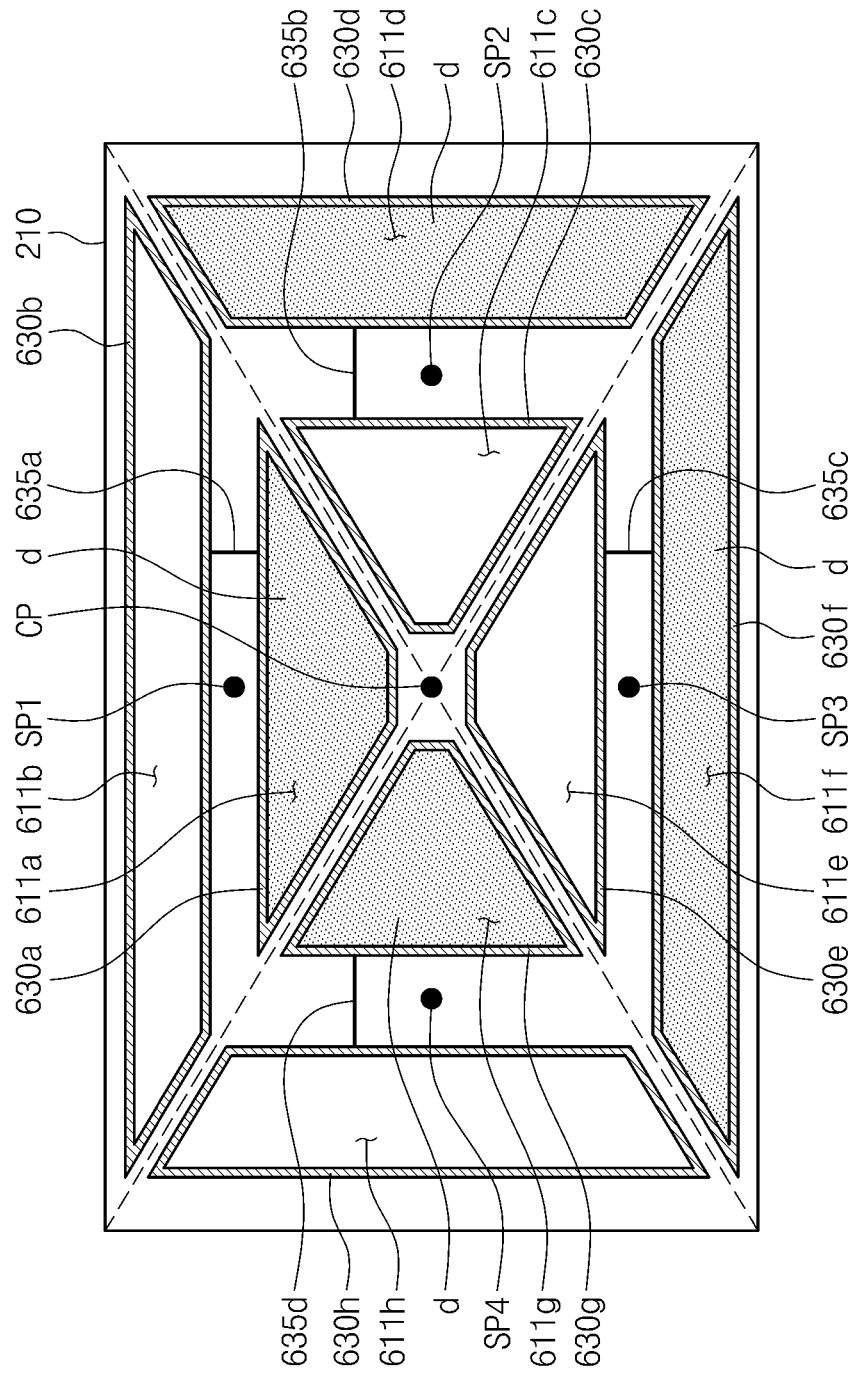

Referring to FIG. 20, each of first to eighth blocks 630a to 630h has a trapezoid shape in a plan view. The first block 630a is disposed between the center feed point CP and the first peripheral feed point SP1 and the second block 630b is disposed between the first peripheral feed point SP1 and an outer edge of the lower electrode 210. Two sides of each of the first and second blocks 630a and 630b are collinear with virtual diagonal lines crossing each other at the center of the lower electrode 210. The third block 630c is disposed between the center feed point CP and the second peripheral feed point SP2 and the fourth block 630d is disposed between the second peripheral feed point SP2 and the outer edge of the lower electrode 210. Two sides of each of the third and fourth blocks 630c and 630d are collinear with the virtual diagonal lines crossing each other at the center of the lower electrode 210.

The fifth block 630e is disposed between the center feed point CP and the third peripheral feed point SP3 and the sixth block 630f is disposed between the third peripheral feed point SP3 and the outer edge of the lower electrode 210. Two sides of each of the fifth and sixth blocks 630e and 630f are collinear with the virtual diagonal lines crossing each other at the center of the lower electrode 210. The seventh block 630g is disposed between the center feed point CP and the fourth peripheral feed point SP4 and the eighth block 630h is disposed between the fourth peripheral feed point SP4 and the outer edge of the lower electrode 210. Two sides of each of the seventh and eighth blocks 630g and 630h are collinear with the virtual diagonal lines crossing each other at the center of the lower electrode 210.

A first storage space 611a of the first block 630a and a second storage space 611b of the second block 630b are connected to each other by a first connection line 635a, and a third storage space 611c of the third block 630c and a fourth storage space 611d of the fourth block 630d are connected to each other by a second connection line 635b. A fifth storage space 611e of the fifth block 630e and a sixth space 611f of the sixth block 630f are connected to each other by a third connection line 635c, and a seventh storage space 611g of the seventh block 630g and an eighth storage space 611h of the eighth block 630h are connected to each other by a fourth connection line 635d.

The dielectric substance d is stored in one of the first and second storage spaces 611a and 611b and moves to the other one of the first and second storage spaces 611a and 611b by a first fluid transfer unit (not shown). The dielectric substance d is stored in one of the third and fourth storage spaces 611c and 611d and moves to the other one of the third and fourth storage spaces 611c and 611d by a second fluid transfer unit (not shown). The dielectric substance d is stored in one of the fifth and sixth storage spaces 611e and 611f and moves to the other one of the fifth and sixth storage spaces 611e and 611f by a third fluid transfer unit (not shown). The dielectric substance d is stored in one of the seventh and eighth storage spaces 611g and 611h and moves to the other one of the seventh and eighth storage spaces 611g and 611h by a fourth fluid transfer unit (not shown).

Figure 21:
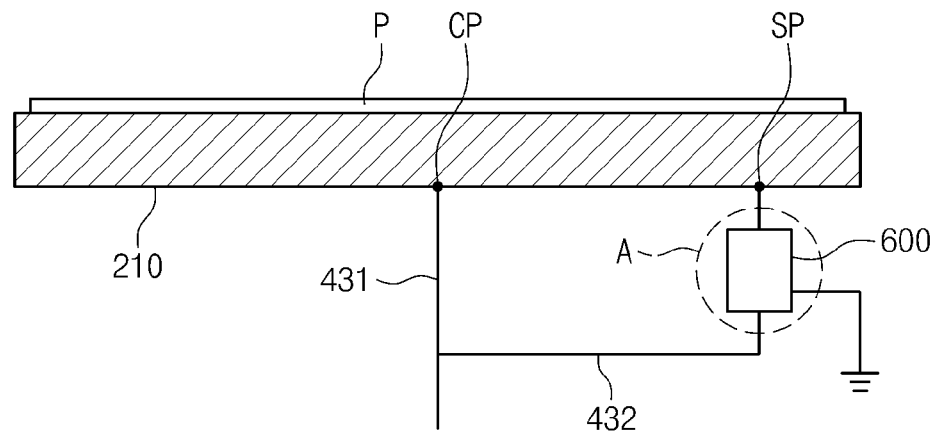
FIG. 21 is a view showing another exemplary embodiment of a modulator according to the invention.

FIG. 21 is a view showing another exemplary embodiment of a modulator according to the invention.

Referring to FIG. 21, a modulator 600 is connected to a second supply line 432.

Figure 22:
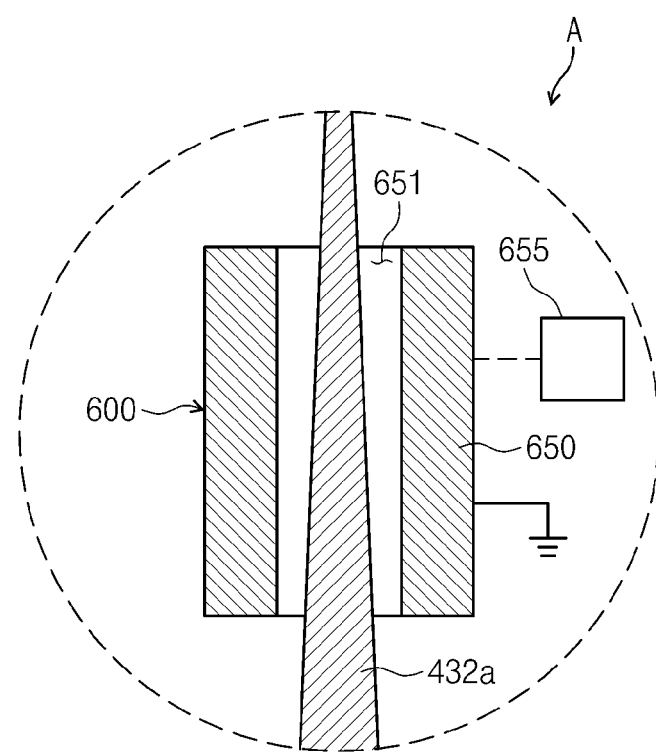
FIG. 22 is a partially enlarged view showing an exemplary embodiment of portion A of FIG. 21 according to the invention.

FIG. 22 is a partially enlarged view showing an exemplary embodiment of portion A of FIG. 21 according to the invention.

Referring to FIG. 22, the second supply line 432 has a tapered area 432a having a cross-sectional width that is gradually decreased in a direction toward a peripheral feed point SP. The modulator 600 includes a dielectric substance block 650 and a block moving unit 655. The dielectric substance block 650 includes an inner path 651 extended through a thickness thereof and surrounds the second supply line 432, such as the tapered area 432a of the second supply line 432. The dielectric substance block 650 may be grounded. The block moving unit 655 moves the dielectric substance block 650 along the second supply line 432, such as in a direction of the longitudinal axis of the second supply line 432. The block moving unit 655 repeatedly moves the dielectric substance block 650 in the taper area 432a of the second supply line 432. The dielectric substance block 650 may be moved into contact with the lower electrode 210 and may be separated from the lower electrode 210. According to the movement of the dielectric substance block 650, the position of the peak of the standing wave may be changed.

Figure 23:
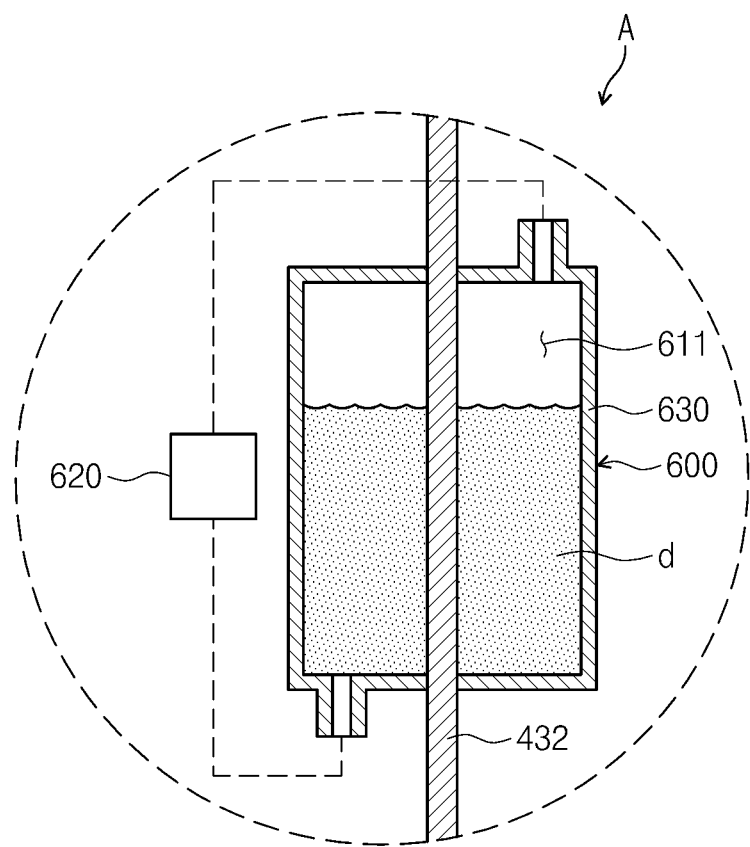
FIG. 23 is a partially enlarged view showing another exemplary embodiment of portion A of FIG. 21 according to the invention.

FIG. 23 is a partially enlarged view showing another exemplary embodiment of portion A of FIG. 21 according to the invention.

Referring to FIG. 23, the modulator 600 includes a block 630 and a dielectric fluid supply unit 620. The block 630 is provided to surround a portion of the second supply line 432 and includes a storage space 611 included therein. The second supply line 432 may be disposed at an interior of the block 630 of the modulator 600 such that the second supply line 432, and may extend completely through a thickness of the block 630 to protrude from opposing ends of the block 630. The dielectric substance supply unit 620 supplies the dielectric substance d into the storage space 611 of the dielectric substance block 630 and withdraws the dielectric substance d stored in the storage space 611. The wavelength of the high frequency transmitted through the second supply line 432 is changed while passing through the dielectric substance d stored in the storage space 611. The change in the wavelength of the high frequency depends on an amount of the dielectric substance d stored in the storage space 611. The variation in the wavelength of the high frequency moves the position of the peak of the standing wave.

Figure 24:
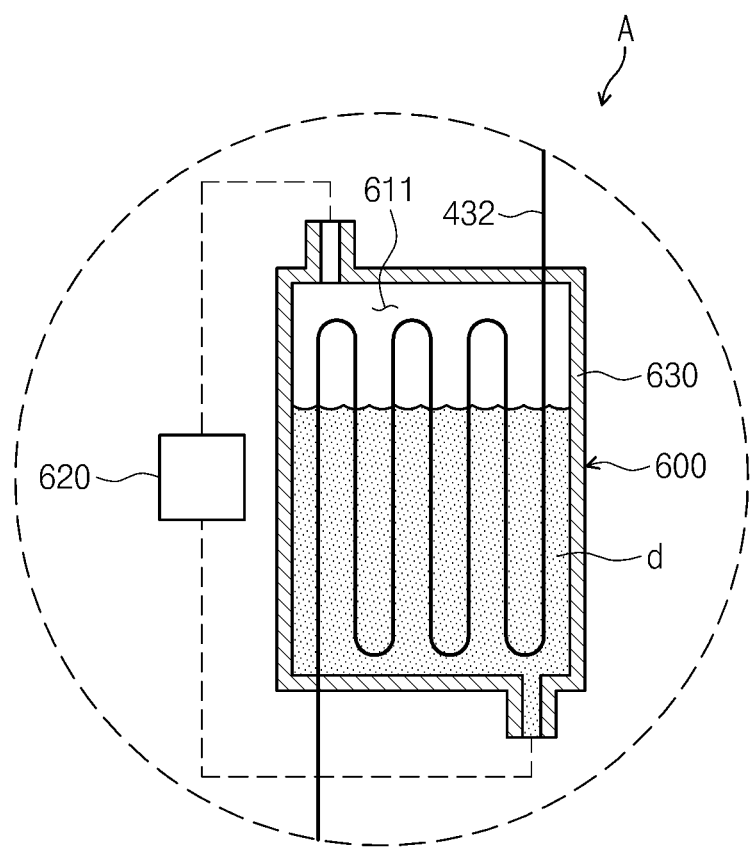
FIG. 24 is a partially enlarged view showing another exemplary embodiment of portion A of FIG. 21 according to the invention.

FIG. 24 is a partially enlarged view showing another exemplary embodiment of portion A of FIG. 21 according to the invention.

Referring to FIG. 24, the second supply line 432 is bent several times in an inner space 611 of a block 630 to allow the second supply line 432 disposed in the inner space 611 of the block 630 to have a length longer than that of the second supply line 432 shown in FIG. 23. Accordingly, a contact area between the second supply line 432 and the dielectric substance d increases, and thus the variation in the wavelength of the high frequency becomes larger.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A substrate-treating apparatus comprising:
   a process chamber comprising a space therein;
   a lower electrode in the space of the process chamber, wherein the lower electrode supports the substrate;
   an upper electrode which faces the lower electrode which supports the substrate, in the space of the process chamber;
   a high frequency supply line comprising a plurality of feed points at which is applied a high frequency power to the lower electrode; and
   a modulator which disposes a dielectric substance at a lower portion of the lower electrode,
   wherein in a plan view of the lower electrode in the space of the process chamber, the lower portion at which the dielectric substance is supplied is disposed between a center portion of the lower electrode and a peripheral area of the lower electrode.

2. The apparatus of claim 1, wherein in the plan view of the lower electrode, the feed points comprise:
   a center feed point at the center portion of the lower electrode and through which the high frequency power is applied to the center portion of the lower electrode; and
   a peripheral feed point at the peripheral area of the lower electrode and through which the high frequency power is applied to the peripheral area of the lower electrode, the peripheral feed point spaced apart from the center feed point of the lower electrode,
   wherein the modulator is proximate to the peripheral feed point.

3. The apparatus of claim 2, wherein
   the lower electrode comprises defined therein a trench extended from a lower surface thereof, the trench between the center feed point and the peripheral feed point, and
   the modulator comprises a dielectric substance supply unit which supplies the dielectric substance in a fluid state into the trench and withdraws the dielectric substance from the trench.

4. The apparatus of claim 2, wherein the modulator comprises:
   a block at the lower portion of the lower electrode and comprising a storage space therein; and
   a dielectric substance supply unit which supplies the dielectric substance in a fluid state into the storage space of the block and withdraws the dielectric substance from the storage space of the block.

5. The apparatus of claim 4, wherein the block has a ring shape which surrounds the peripheral feed point.

6. The apparatus of claim 2, wherein the modulator comprises:
   a dielectric substance block at the lower portion of the lower electrode, and in the plan view between the center feed point and the peripheral feed point; and
   a dielectric substance block moving unit which moves the dielectric substance block to change a distance between the lower electrode and the dielectric substance block.

7. The apparatus of claim 2, wherein the modulator comprises:
   a first block between the center feed point and the peripheral feed point, and comprising a first storage space therein;
   a second block between the peripheral feed point and an outer edge of the lower electrode, and comprising a second storage space therein;
   a connection line which connects the first storage space and the second storage space to each other; and
   a fluid transfer unit which moves the dielectric substance in a fluid state through the connection line, and selectively in and out of the first storage space and the second storage space.

8. The apparatus of claim 7, wherein each of the first block and the second block has a trapezoid shape, and two sides of the trapezoid shape are collinear with diagonal lines which cross each other at the center portion of the lower electrode.

9. The apparatus of claim 7, wherein the first block and the second block are parallel with each other, and each of the first block and the second block has a rectangular shape.

10. The apparatus of claim 7, comprising two peripheral feed points which are arranged along a circumference of the center feed point,
   wherein respective lines between the peripheral feed points and the center feed point form a right angle at the center feed point.

11. The apparatus of claim 1, wherein the feed point comprises a center feed point and a peripheral feed point, the high frequency supply line comprises:
   a first supply line comprising the center feed point, wherein the center feed point applies the high frequency power to the center portion of the lower electrode; and
   a second supply line which is connected to the first supply line, wherein the second supply line applies the high frequency power to the peripheral area of the lower electrode, which is spaced apart from the center portion of the lower electrode, and the modulator is on the second supply line.

12. The apparatus of claim 11, wherein the modulator comprises:
   a dielectric substance block which surrounds the second supply line; and
   a dielectric substance block moving unit which repeatedly moves the dielectric substance block along the second supply line.

13. The apparatus of claim 12, wherein
   the second supply line has a taper area having a cross-sectional width that gradually decreases in a direction toward the peripheral feed point, and
   the dielectric substance block repeatedly moves in the taper area.

14. The apparatus of claim 11, wherein the modulator comprises:
   a block which surrounds the second supply line and comprises a storage space therein; and
   a dielectric substance supply unit which supplies the dielectric substance in a fluid state into the storage space of the block and withdraws the dielectric substance from the storage space of the block.

* * * * *